(12) United States Patent
Yoo

(10) Patent No.: US 9,519,228 B2
(45) Date of Patent: Dec. 13, 2016

(54) SUBSTRATE HOLDING APPARATUS AND METHOD

(71) Applicant: Samsung Display Co., Ltd., Yongin, Gyeonggi-Do (KR)

(72) Inventor: Sung Hune Yoo, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 363 days.

(21) Appl. No.: 13/956,559

(22) Filed: Aug. 1, 2013

(65) Prior Publication Data

US 2014/0293257 A1 Oct. 2, 2014

(30) Foreign Application Priority Data

Apr. 1, 2013 (KR) .................. 10-2013-0035282

(51) Int. Cl.
*G03F 7/20* (2006.01)
*H01L 21/687* (2006.01)

(52) U.S. Cl.
CPC .......... *G03F 7/70691* (2013.01); *G03F 7/707* (2013.01); *H01L 21/68742* (2013.01); *G03F 7/70791* (2013.01)

(58) Field of Classification Search
CPC .. G03F 7/70691; G03F 7/707; G03F 7/70791; H01L 21/6838; H01L 21/68742
USPC ................................................ 355/72, 73
See application file for complete search history.

(56) References Cited

U.S. PATENT DOCUMENTS

| 7,292,427 B1 | 11/2007 | Murdoch et al. |
| 2013/0063709 A1* | 3/2013 | Chen .................. G03F 7/70733 355/67 |
| 2013/0146785 A1* | 6/2013 | Gilissen .................. G03F 7/09 250/453.11 |

FOREIGN PATENT DOCUMENTS

| JP | 2008-211098 A | 9/2008 | |
| JP | WO 2012157231 A1 * | 11/2012 | ....... H01L 21/67748 |
| JP | WO 2014188572 A1 * | 11/2014 | ......... H01L 21/6838 |
| KR | 10-2009-0013587 A | 2/2009 | |
| KR | 10-2012-0075314 A | 7/2012 | |

OTHER PUBLICATIONS

English translation of KR-2012-0075314, originally published Jul. 6, 2012.*
Machine translation of WO2012157231, published Nov. 22, 2012.*
A. Une, et al, Development of a new porous pin chuck for lithography, *ScienceDirect*, Jan. 26, 2008, Elsevier B.V., Web.

* cited by examiner

*Primary Examiner* — Steven H Whitesell Gordon
(74) *Attorney, Agent, or Firm* — Robert E. Bushnell, Esq.

(57) ABSTRACT

Provided are a substrate holding apparatus and a method of using the substrate holding apparatus. According to an aspect of the present invention, there is provided a substrate holding apparatus comprising a stage on which a substrate is placed, and at least one lift bar which separates the substrate from the stage by raising the substrate or placing the substrate on the stage by lowering the substrate. The lift bar comprises a body and a head. The head is connected to an end of the body, contacts the substrate, and is formed of a porous material.

20 Claims, 14 Drawing Sheets

SUBSTRATE HOLDING APPARATUS AND METHOD

CLAIM OF PRIORITY

This application claims priority from Korean Patent Application No. 10-2013-0035282 filed on Apr. 1, 2013 in the Korean Intellectual Property Office, the disclosure of which is incorporated herein by reference in its entirety.

BACKGROUND OF THE INVENTION

Field of the Invention

Embodiments of the present invention generally relate to a substrate holding apparatus and a method of using the same, and more particularly, to a substrate holding apparatus having a lift bar including a porous head and a method of using the same.

Description of the Related Art

A coating process may be performed to manufacture various products including semiconductor devices, displays, and solar cells. For example, a solution may be coated on a substrate using inkjet printing in order to form a polymer organic light-emitting layer included in an organic light-emitting display.

Here, the solution may be coated on the substrate in a state where the substrate is fixed on a stage. The substrate may be fixed on the stage by suction. Generally, a groove is formed in an upper part of the stage, and the substrate is vacuum-sucked onto the stage by a vacuum pump connected to the groove. Here, if a vacuum suction force generated at an interface between the substrate and the stage is not uniform, the surface of the substrate may become uneven. Accordingly, the solution may be coated to a non-uniform thickness on the substrate, thereby forming coating stains.

In particular, if a lift bar is installed inside the stage in order to separate the substrate from the stage by raising the substrate or place the substrate on the stage by lowering the substrate, more coating stains may be formed in a region on the lift bar which contacts the substrate.

SUMMARY OF THE INVENTION

Aspects of the present invention provide a substrate holding apparatus which can stably fix a substrate onto a head and a stage by suction and improve the flatness of a surface of the fixed substrate.

Aspects of the present invention also provide a substrate holding method which can stably fix a substrate onto a head and a stage by suction and improve the flatness of a surface of the fixed substrate.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a substrate holding apparatus comprising a stage on which a substrate is placed, and at least one lift bar which separates the substrate from the stage by raising the substrate or placing the substrate on the stage by lowering the substrate. The lift bar comprises a body and a head which is connected to an end of the body, contacts the substrate, and is formed of a porous material.

According to another aspect of the present invention, there is provided a substrate holding apparatus comprising a stage on which a substrate is placed, and at least one lift bar which separates the substrate from the stage by raising the substrate or placing the substrate on the stage by lowering the substrate. The lift bar comprises a body and a head which is connected to an end of the body and contacts the substrate. The stage and the head are formed of the same material.

According to still another aspect of the present invention, there is provided a substrate holding method comprising placing a substrate on a head of a raised lift bar, and placing the substrate on a stage by lowering the lift bar. The head is formed of a porous material.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
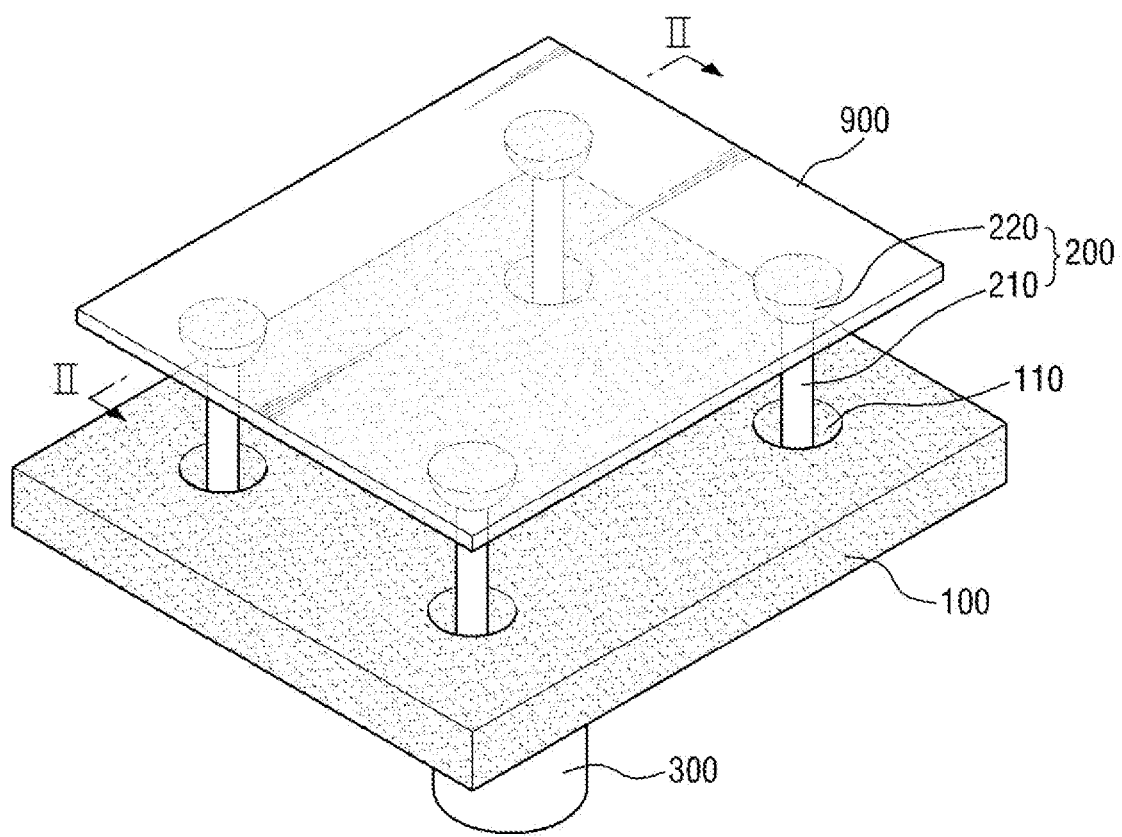
FIG. 1 is an oblique view of raised lift bars in a substrate holding apparatus constructed as an embodiment according to the principles of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Hereinafter, embodiments of the present invention will be described with reference to the attached drawings.

Figure 2:
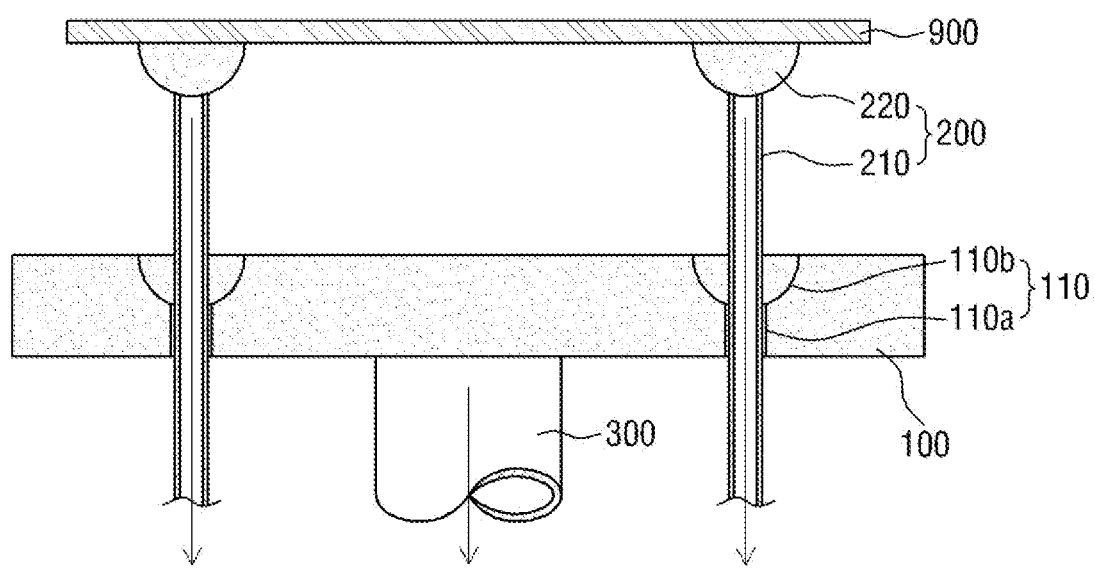
FIG. 2 is a cross-sectional view taken along line II-II of FIG. 1.
Figure 3:
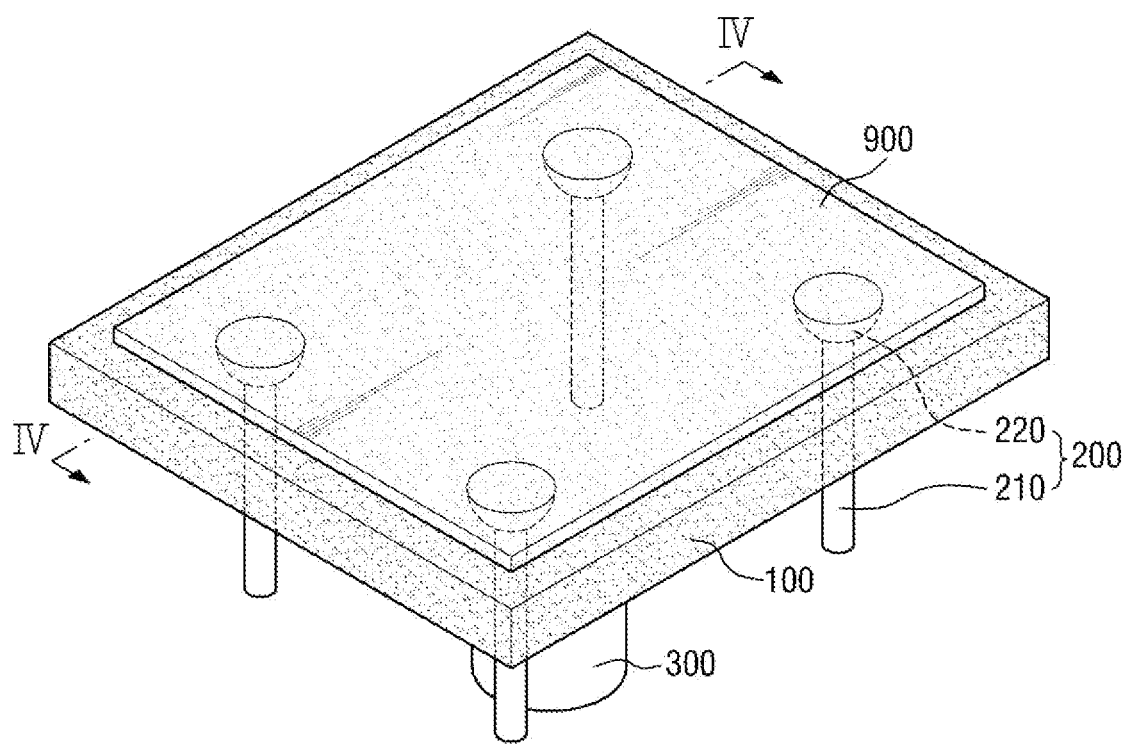
FIG. 3 is an oblique view of lowered lift bars in the substrate holding apparatus of FIG. 1.
Figure 4:
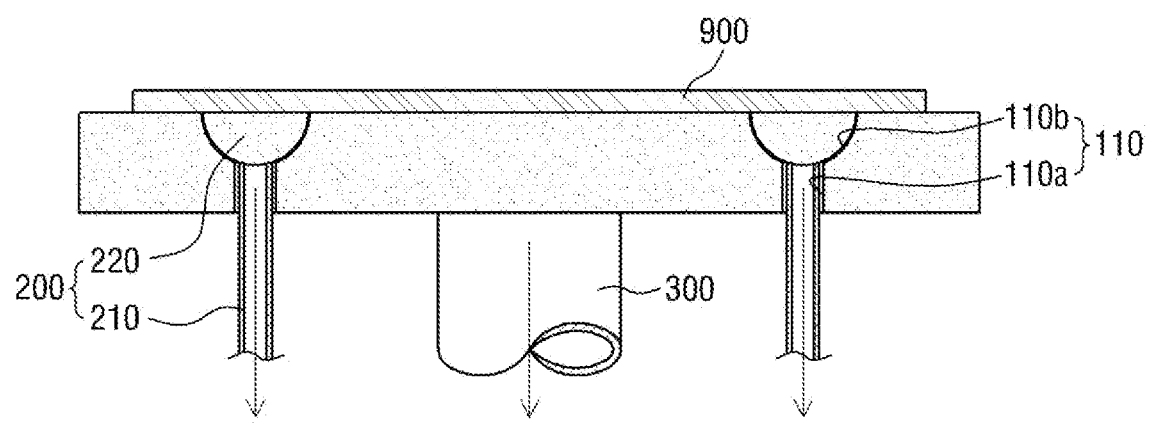
FIG. 4 is a cross-sectional view taken along line IV-IV of FIG. 3.
Figure 5:
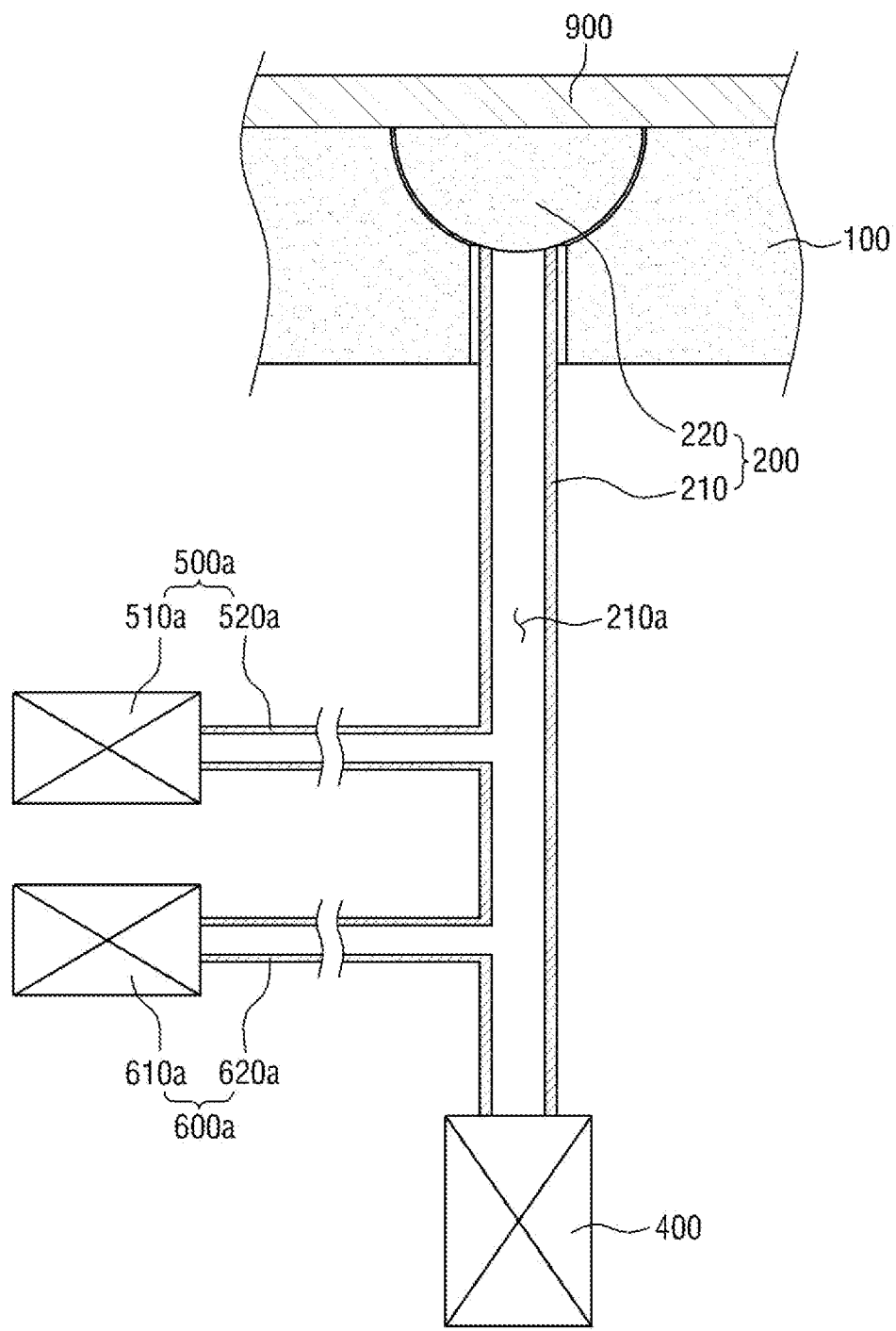
FIG. 5 is an enlarged cross-sectional view of a lift bar of the substrate holding apparatus of FIG. 1.
Figure 6:
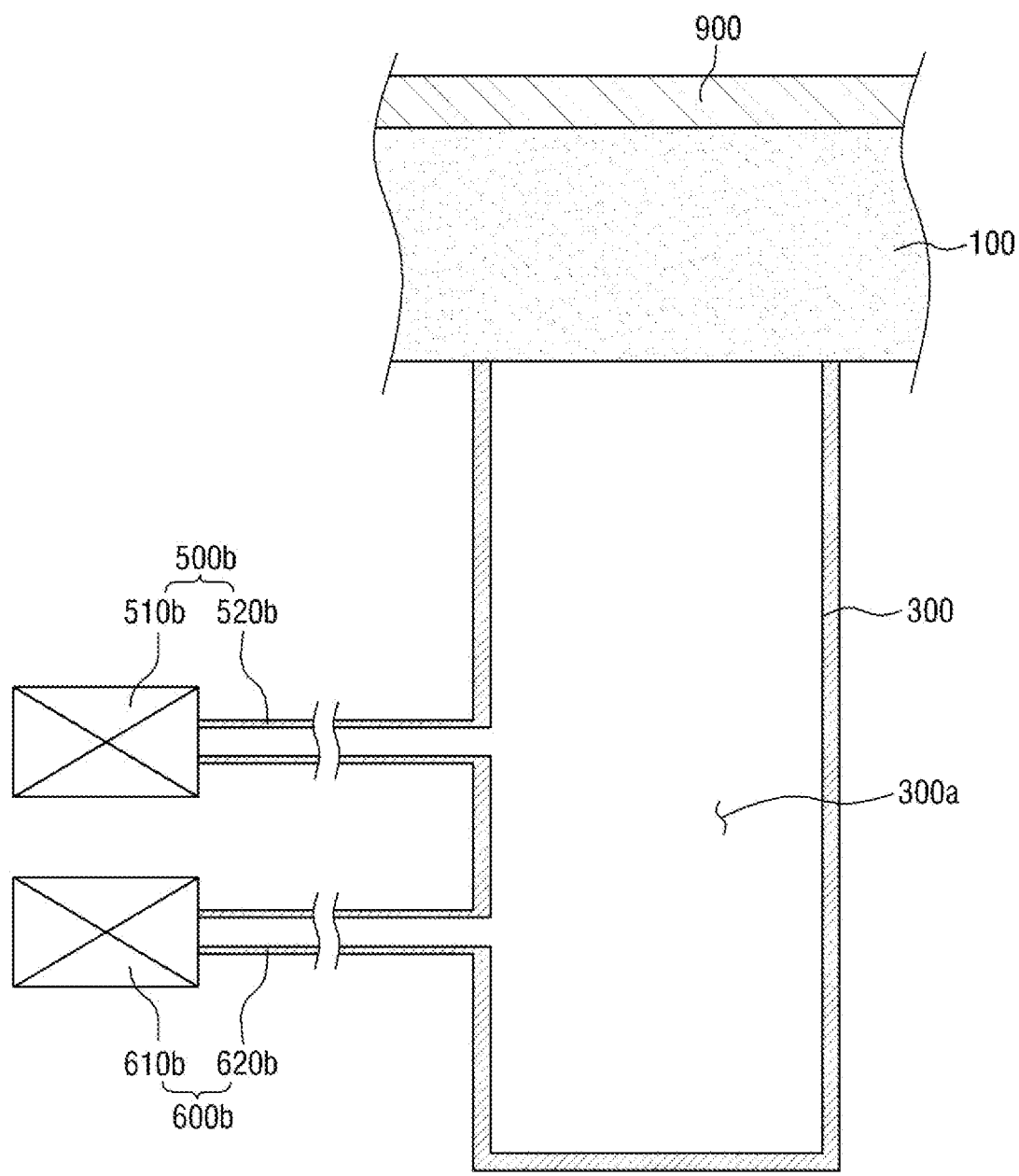
FIG. 6 is an enlarged cross-sectional view of a support bar of the substrate holding apparatus of FIG. 1.
Figure 7:
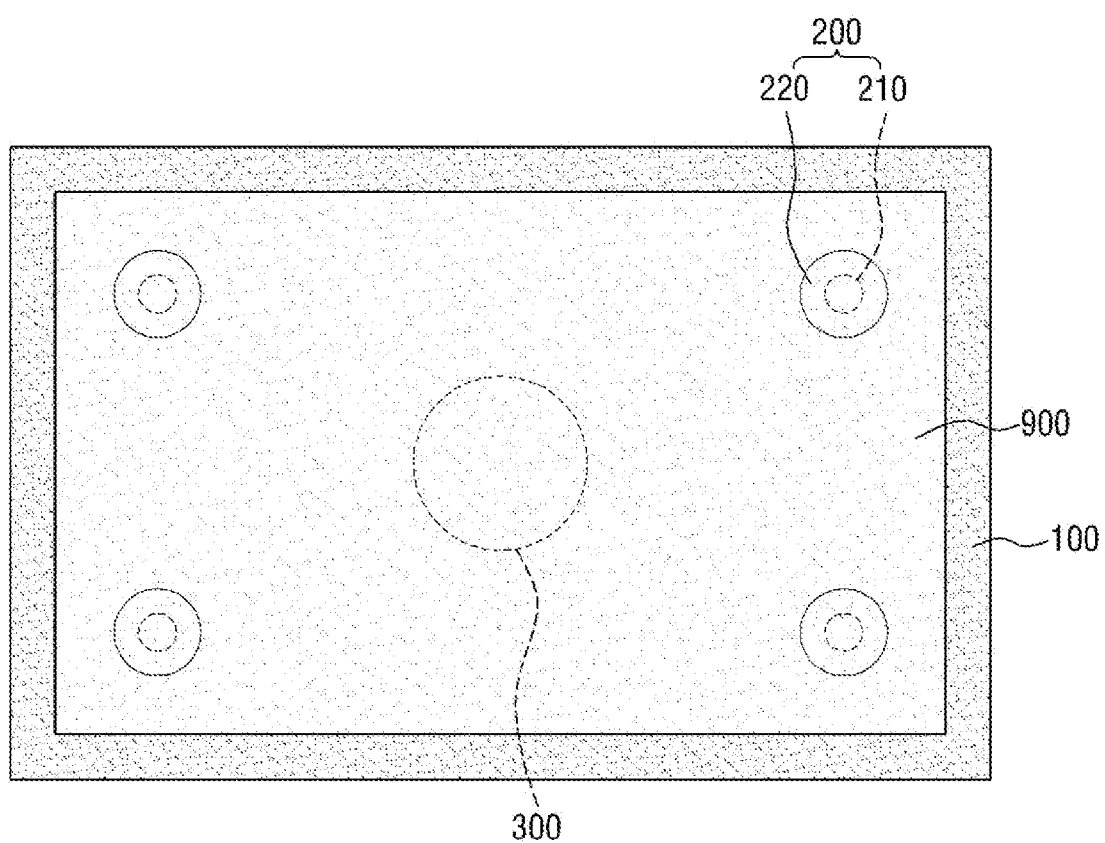
FIG. 7 is a plan view of the substrate holding apparatus of FIG. 1.

FIG. 1 is an oblique view of raised lift bars 200 of a substrate holding apparatus constructed as an embodiment according to the principles of the present invention. FIG. 2 is a cross-sectional view taken along line II-II of FIG. 1. FIG. 3 is an oblique view of the lowered lift bars 200 in the substrate holding apparatus of FIG. 1. FIG. 4 is a cross-sectional view taken along line IV-IV of FIG. 3. FIG. 5 is an enlarged cross-sectional view of the lift bar 200 in the substrate holding apparatus of FIG. 1. FIG. 6 is an enlarged cross-sectional view of a support bar 300 of the substrate holding apparatus of FIG. 1. FIG. 7 is a plan view of the substrate holding apparatus of FIG. 1. Referring to FIGS. 1 through 7, the substrate holding apparatus according to the current embodiment includes a stage 100 and a lift bar 200. In addition, the substrate holding apparatus according to the current embodiment may further include the support bar 300, a lift bar driver 400, vacuum treatment units 500a and 500b, and gas supply units 600a and 600b.

The substrate holding apparatus according to the current embodiment may fix a substrate 900 in position in order to stably coat a solution on the substrate 900. In addition, the substrate holding apparatus according to the current embodiment may fix the substrate 900 in position in order to mount an electronic part, such as a diode, a condenser or a resistor, on the substrate 900. That is, the substrate holding apparatus according to the current embodiment may fix the substrate 900 in position for various purposes, not limited to the aforementioned purposes.

The substrate 900 may be, but is not limited to, a thin-film transistor (TFT) substrate, a printed circuit board (PCB), or a flexible substrate. In addition, the substrate 900 may not only be a substrate as its name suggests, but also a film or a thin film.

The substrate 900 may be shaped like a cubic plate. The substrate 900 may be a rigid substrate. However, the present invention is not limited thereto, and the substrate 900 may also be a flexible substrate. If the substrate 900 is a rigid substrate, it may be formed of, e.g., transparent glass. If the substrate 900 is a flexible substrate, it may be formed of a plastic material having superior thermal resistance and durability, such as polyethylene ether phthalate, polyethylene naphthalate, polycarbonate, polyarylate, polyetherimide, polyethersulfone, or polyimide. Although not shown in the drawings, a device layer may be located on the substrate 900. The device layer may include various devices including TFTs and capacitors. The device layer may be formed on the substrate 900 by, e.g., a deposition process.

The substrate 900 may be placed on the stage 100 and/or the lift bar 200 by a transfer robot or a transfer rail or manually by a worker.

The stage 100 may support the substrate 900. That is, the substrate 900 may be placed on a surface of the stage 100. The stage 100 may be shaped like a cubic plate. In an exemplary embodiment, the area of the surface of the stage 100 which supports the substrate 900 may be greater than or equal to the area of a surface of the substrate 900 which contacts the stage 100. In other words, a width of the stage 100 may be equal to or greater than a width of the substrate 900. In another exemplary embodiment, the substrate 900 may overlap a central portion of the stage 100.

The stage 100 may be formed of a porous material. In an exemplary embodiment, the stage 100 may be formed of porous ceramic such as zeolite, graphite or a combination of these materials. In another exemplary embodiment, the stage 100 may be formed of porous carbon, e.g., activated carbon. However, the type of the porous material that forms the stage 100 may not be particularly limited. That is, the stage 100 according to the present invention can be formed using all porous materials that have been developed and commercialized or are realizable depending on future technological developments. In other words, the scope of the present invention is not limited by the type of the porous material.

The stage 100 may include at least one insertion hole 110. In other words, the stage 100 may define at least one insertion hole 110. The insertion hole 110 may penetrate the stage 100. The lift bar 200 may be inserted into the insertion hole 110. Since the lift bar 200 makes an up and down motion in a state where it is inserted into the insertion hole 110, a diameter of the insertion hole 110 may be greater than or equal to a diameter of the lift bar 200.

The stage 100 may include a plurality of insertion holes 110. In this case, the insertion holes 110 may be located at corners of the stage 100. In an exemplary embodiment, four insertion holes 110 may respectively be formed at the corners of the stage 100. However, the present invention is not limited hereto. In another exemplary embodiment, the insertion holes 110 may be point-symmetric with respect to the center of the stage 100. In another exemplary embodiment, the insertion holes 110 may be line-symmetric with respect to a virtual line that halves the stage 100.

The insertion hole 110 may include a first insertion hole 110a and a second insertion hole 110b.

The first insertion hole 110a may be formed in a lower part of the stage 100. The first insertion hole 110a may be pipe-shaped. In addition, a diameter of the first insertion hole 110a may be substantially constant wherever measured. A shape of the first insertion hole 110a may correspond to a shape of a body 210 of the lift bar 200 which will be described later. That is, the diameter of the first insertion hole 110a may be substantially equal to a diameter of the body 210 of the lift bar 200.

The second insertion hole 110b may be formed in an upper part of the stage 100. The second insertion hole 110b may be semi-spherical. In addition, a diameter of the second insertion hole 110b may increase toward the top of the stage 100. A shape of the second insertion hole 110b may correspond to a shape of a head 220 of the lift bar 200 which will be described later. In an example, if the head 220 of the lift bar 200 is semi-spherical, the second insertion hole 110b may also be semi-spherical. In another example, if the head 220 of the lift bar 200 is cubic, the second insertion hole 110b may also be cubic.

The second insertion hole 110b may be connected to the first insertion hole 110a. The diameter of the second insertion hole 110b may be greater than or equal to the diameter of the first insertion hole 110a. In other words, a width of the second insertion hole 110b may be greater than or equal to a width of the first insertion hole 110a. In addition, part of the second insertion hole 110b may overlap the first insertion hole 110a, and the whole of the first insertion hole 110b may be overlapped by the second insertion hole 110b. A central portion of the second insertion hole 110b may overlap the first insertion hole 110a. An axis that connects a center of the second insertion hole 110b and a center of the first insertion hole 110a may be perpendicular to the surface of the stage 100.

The lift bar 200 may be inserted into the insertion hole 110 of the stage 100. The lift bar 200 may separate the substrate 900 from the stage 100 by raising the substrate 900 or place the substrate 900 on the stage 100 by lowering the substrate 900. The lift bar 200 may be provided in plural form, and the number of the lift bars 200 may be equal to the number of the insertion holes 110. In an exemplary embodiment, a plurality of lift bars 200 may be located at the corners of the stage 100. In an exemplary embodiment, four lift bars 200 may respectively be located at the corners of the stage 100. However, the present invention is not limited thereto. In another exemplary embodiment, the lift bars 200 may be point-symmetric with respect to the center of the stage 100. In another exemplary embodiment, the lift bars 200 may be line-symmetric with respect to the virtual line that halves the stage 100.

The lift bar 200 may include the body 210 and the head 220.

The body 210 may extend in one direction. If the direction in which the body 210 extends is a lengthwise direction of the body 210, the lengthwise direction of the body 210 may be perpendicular to the surface of the stage 100. In addition, the body 210 may be inserted into the insertion hole 110. The body 210 may be connected to the lift bar driver 400 which will be described later and may be moved up and down by the lift bar driver 400. When the body 210 makes an up and down motion, it may pass through both the first insertion hole 110a and the second insertion hole 110b. The body 210 may be pipe-shaped. The diameter of the body 210 may be substantially along the lengthwise direction of the body 210. The shape of the body 210 may correspond to the shape of the first insertion hole 110a described above. That is, the diameter of the body 210 may be substantially equal to the diameter of the first insertion hole 110a.

The body 210 may have a first inner space 210a. That is, the body 210 may be a pipe having the first inner space 210a formed therein. An end of the body 210 may be open so as to be connected to the first inner space 210a and may be connected to the head 220 which will be described later. As will be described later, the substrate 900 may be sucked onto the lift bar 200 by vacuum-treating the first inner space 210a using a first vacuum treatment unit 500a or may be separated from the lift bar 200 by supplying a gas to the first inner space 210a using a first gas supply unit 600a.

The head 220 may support the substrate 900 while in contact with the substrate 900. In addition, the head 220 may be semi-spherical. If the head 220 is semi-spherical, a flat surface of the head 220 may contact the substrate 900. A diameter of the head 220 may increase toward the top thereof. The shape of the head 220 may correspond to the shape of the second insertion hole 110b. In an example, if the second insertion hole 110b is semi-spherical, the head 200 may also be semi-spherical. In another example, if the second insertion hole 110b is cubic, the head 220 may also be cubic. In addition, as the body 210 moves up and down, the head 220 connected to the body 210 may also move up and down. In this case, the head 220 may pass through the second insertion hole 110b only. That is, even if the head 220 makes an up and down motion, since the head 220 is wider than the first insertion hole 110a, the head 220 may be unable to pass through the first insertion hole 110a.

The head 220 may be connected to an end of the body 210. The diameter of the head 220 may be greater than or equal to the diameter of the body 210. In other words, a width of the head 220 may be greater than or equal to a width of the body 210. In addition, part of the head 220 may overlap the body 210, and the whole of the body 210 may be overlapped by the head 220. A central portion of the head 220 may overlap the body 210. An axis that connects a center of the head 220 and a center of the body 210 may be perpendicular to the surface of the stage 100. The open end of the body 210 directly connects to the head 220.

The head 220 may be formed of substantially the same material as the stage 100. In an exemplary embodiment, if the stage 100 is formed of porous ceramic such as zeolite, the head 220 may also be formed of porous ceramic. In another exemplary embodiment, if the stage 100 is formed of porous carbon such as activated carbon, the head 220 may also be formed of porous carbon. If both the head 220 and the stage 100 are formed of a porous material, the volume of cavities included in the head 220 may be substantially equal to the volume of cavities included in the stage 100.

When the lift bar 200 places the substrate 900 on the stage 100 by lowering the substrate 900, the head 220 may fill the second insertion hole 110b. In other words, the head 220 may be closely attached to the second insertion hole 110b. If the head 220 and the second insertion hole 110b are formed of the same material, in particular, a porous material, a gas may pass through an interface between the head 220 and the second insertion hole 110b. That is, a plurality of connection holes may be formed in the interface between the head 220 and the second insertion hole 110b. In addition, when the lift bar 200 places the substrate 900 on the stage 100 by lowering the substrate 900, the surface of the stage 100 which contacts the substrate 900 and the surface of the head 220 which contacts the substrate 900 may lie in the same plane. That is, the substrate 900 may be directly placed on a flat surface formed by the stage 100 and the head 220 of the lift bar 200.

The support bar 300 may be disposed under the stage 100. The support bar 300 may support the stage 100. The support bar 300 may extend in one direction. If the direction in which the support bar 300 extends is a lengthwise direction of the support bar 300, the lengthwise direction of the support bar 300 may be perpendicular to the surface of the stage 100. Unlike the lift bar 200, one end of the support bar 300 may be fixed in position. At least one support bar 300 may be provided. In the exemplary embodiment illustrated in the drawings, one support bar 300 is provided. However, the present invention is not limited thereto, and a plurality of support bars 300 may also be provided. The support bar 300 may be surrounded by a plurality of lift bars 200. The lift bars 200 may be placed point-symmetric with respect to the support bar 300. In addition, the support bar 300 may overlap the central portion of the stage 100. The support bar 300 may be pipe-shaped. A diameter of the support bar 300 may be greater than or equal to the diameter of the body 210 of the lift bar 200.

The support bar 300 may have a second inner space 300a. That is, the support bar 300 may be a pipe having the second inner space 300a formed therein. An end of the support bar 300 may be open so as to be connected to the second inner space 300a and may be connected to the stage 100. As will be described later, the substrate 900 may be sucked onto the stage 100 by vacuum-treating the second inner space 300a using a second vacuum treatment unit 500b or may be separated from the stage 100 by supplying a gas to the second inner space 300a using a second gas supply unit 600b.

The lift bar driver 400 may be connected to the lift bar 200 so as to move the lift bar 200 up and down. When the lift bar 200 is raised by the lift bar driver 400, the substrate 900 in contact with the stage 100 may be separated from the stage 100. When the lift bar 200 is lowered by the lift bar driver 400, the substrate 900 separated from the stage 100 may be brought into contact with the stage 100. In an exemplary embodiment, the lift bar driver 400 may be connected to an end of the body 210 which is opposite the other end thereof connected to the head 220. In addition, the lift bar driver 400 may be disposed under the stage 100 with a gap from the stage 100. However, the present invention is not limited thereto, and the lift bar driver 400 may also be formed integrally with the stage 100.

The first vacuum treatment unit 500a may be located at a side of the body 210 of the lift bar 200. The first vacuum treatment unit 500a may include a first vacuum pump 510a and a first vacuum line 520a. The first vacuum pump 510a may be a device that removes gas molecules existing in a space, and the first vacuum line 520a may be a pipe that connects the first vacuum pump 510a and the first inner space 210a of the body 210. The first vacuum treatment unit 500a may suck the substrate 900 onto the head 220 by vacuum-treating the first inner space 210a in response to a control signal from a first controller (not shown). Specifically, when the first vacuum pump 510a sucks in a gas through the first vacuum line 520a, the first inner space 210a and cavities inside the head 220 formed of a porous material may become a vacuum state. Accordingly, the substrate 900 in contact with the head 220 may be sucked onto the surface of the head 220.

The first gas supply unit 600a may be located at the side of the body 210 of the lift bar 200. In addition, the first gas supply unit 600a may be placed adjacent to the first vacuum treatment unit 500a. The first gas supply unit 600a may include a first gas storage unit 610a and a first gas supply line 620a. The first gas storage unit 610a may store a gas that is to be injected into the first inner space 210a. Here, the gas to be injected into the first inner space 210a may be an inert gas such as a neon gas, a nitrogen gas, a carbonic acid gas or an argon gas. The first gas supply line 620a may be a pipe that connects the first gas storage unit 610a and the first inner space 210a. The first gas supply unit 600a may separate the substrate 900 from the head 220 by supplying the gas to the first inner space 210a in response to a control signal from the first controller (not shown). Specifically, when the gas is injected from the first gas storage unit 610a into the first inner space 210a via the first gas supply line 620a, it may also be injected into the cavities inside the head 220 which is connected to the first inner space 210a and is formed of a porous material. Accordingly, the pressure inside the first inner space 210a and the cavities of the head 220 may increase, thereby easily separating the substrate 900 from the surface of the head 220.

The second vacuum treatment unit 500b may be located at a side of the support bar 300. The second vacuum treatment unit 500b may include a second vacuum pump 510b and a second vacuum line 520b. The second vacuum pump 510b may be a device that removes gas molecules existing in a space, and the second vacuum line 520b may be a pipe that connects the second vacuum pump 510b and the second inner space 300a of the support bar 300. The second vacuum treatment unit 500b may suck the substrate 900 onto the stage 100 by vacuum-treating the second inner space 300a in response to a control signal from a second controller (not shown). Specifically, when the second vacuum pump 510b sucks in a gas through the second vacuum line 520b, the second inner space 300a and cavities inside the stage 100 formed of a porous material may become a vacuum state. Accordingly, the substrate 900 in contact with the stage 100 may be sucked onto the surface of the stage 100.

The second gas supply unit 600b may be located at the side of the support bar 300. In addition, the second gas supply unit 600b may be placed adjacent to the second vacuum treatment unit 500b. The second gas supply unit 600b may include a second gas storage unit 610b and a second gas supply line 620b. The second gas storage unit 610b may store a gas that is to be injected into the second inner space 300a. Here, the gas to be injected into the second inner space 300a may be an inert gas such as a neon gas, a nitrogen gas, a carbonic acid gas or an argon gas. The second gas supply line 620b may be a pipe that connects the second gas storage unit 610b and the second inner space 300a. The second gas supply unit 600b may separate the substrate 900 from the stage 100 by supplying the gas to the second inner space 300a in response to a control signal from the second controller (not shown). The first controller that controls the first vacuum treatment unit 500a and the first gas supply unit 600a and the second controller that controls the second vacuum treatment unit 500b and the second gas supply unit 600b may be integrated to a single controller (not shown). Specifically, when the gas is injected from the second gas storage unit 610b into the second inner space 300a via the second gas supply line 620b, it may also be injected into the cavities inside the stage 100 which is connected to the second inner space 300a and is formed of a porous material. Accordingly, the pressure inside the second inner space 300a and the cavities of the stage 100 may increase, thereby easily separating the substrate 900 from the surface of the stage 100.

When the lift bar 200 places the substrate 900 on the stage 100 by lowering the substrate 900, the substrate 900 may contact both the surface of the head 900 and the surface of the stage 100. In this state, the substrate 900 may be sucked onto the surface of the head 220 and the surface of the stage 100 by the first vacuum treatment unit 500a and the second vacuum treatment unit 500b. In this case, a vacuum suction force generated on the surface of the head 220 may be equal to a vacuum suction force generated on the surface of the stage 100.

Hereinafter, a substrate holding method according to an embodiment of the present invention will be described with reference to FIGS. 1 through 4. For simplicity, any redundant description will be omitted.

Referring to FIGS. 1 and 2, in a state where the lift bar 200 is raised, the substrate 900 may be placed on the head 220 of the lift bar 200. Here, the substrate 900 may be placed on the head 220 of the lift bar 200 by a transfer robot or a transfer rail or manually by a worker. In an exemplary embodiment, a transfer robot in contact with a bottom surface of the substrate 900 may place the substrate 900 on the head 220 of the lift bar 200 and then come out of a space between the substrate 900 and the stage 100.

When the substrate 900 is placed on the head 220 of the lift bar 200 in the state where the lift bar 200 is raised, the inside of the lift bar 200 may be vacuum-treated, so that the substrate 900 can be sucked onto the lift bar 200. Specifically, a gas existing inside the lift bar 200 may be sucked in by the first vacuum treatment unit 500a. Accordingly, the substrate 900 may be sucked onto a surface of the head 220.

Referring to FIGS. 3 and 4, the substrate 900 may be placed on the stage 100 by lowering the lift bar 200. Since the lift bar 200 is lowered in a state where the substrate 900 is sucked onto the head 220 of the lift bar 200, the substrate 900 can be moved in a stable manner. That is, the substrate 900 can be prevented from slipping or being damaged while the lift bar 200 is descending.

After the substrate 900 is placed on the stage 100 by lowering the lift bar 200, the inside of the support bar 300 that supports the stage 100 and the inside of the lift bar 200 may be vacuum-treated, so that the substrate 900 can be sucked onto the stage 100 and the lift bar 200. Specifically, a gas existing inside the lift bar 200, a gas existing inside the support bar 300, and a gas existing inside the stage 100 may be simultaneously sucked in by the first vacuum treatment unit 500a and the second vacuum treatment unit 500b. Accordingly, the substrate 900 may be sucked onto a surface of the head 220 and a surface of the stage 100.

As described above, in the substrate holding apparatus and method according to the current embodiment of the present invention, both the head 220 and the stage 100 may be formed of a porous material. In addition, a vacuum suction force generated on a surface of the head 220 which contacts the substrate 900 may be equal to a vacuum suction force generated on a surface of the stage 100 which contacts the substrate 900. Accordingly, the substrate 900 can be stably sucked onto the head 220 and the stage 100, and the flatness of the surface of the substrate 900 fixed to the head 220 and the stage 100 can be improved. Therefore, when a solution is coated on the substrate 900, the thickness uniformity of the coated solution can be improved. In particular, it is possible to prevent the surface of the substrate 900 placed on the surface of the head 220 which contacts the substrate 900 from becoming uneven and thus forming coating stains. Furthermore, an electronic part such as a diode, a condenser, or a resistor can be mounted precisely at a desired position on the substrate 900.

Figure 8:
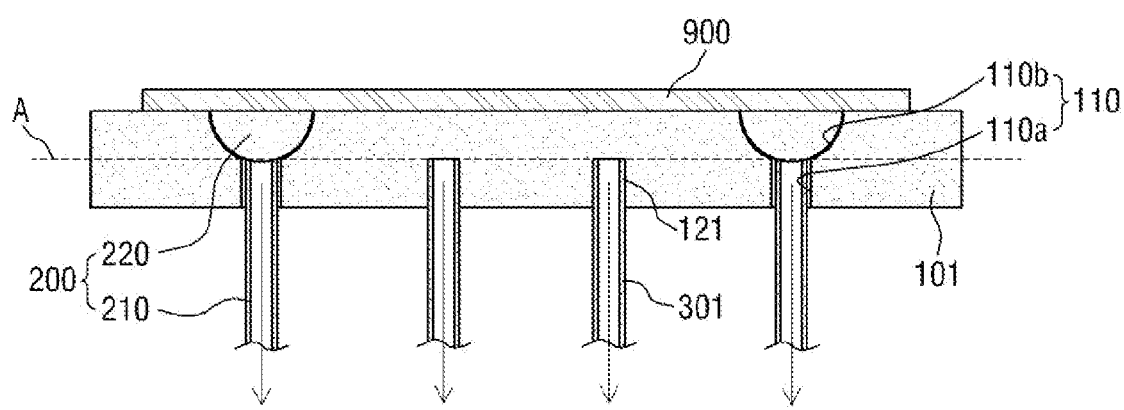
FIG. 8 is a cross-sectional of lowered lift bars in a substrate holding apparatus constructed as another embodiment according to the principles of the present invention.
Figure 9:
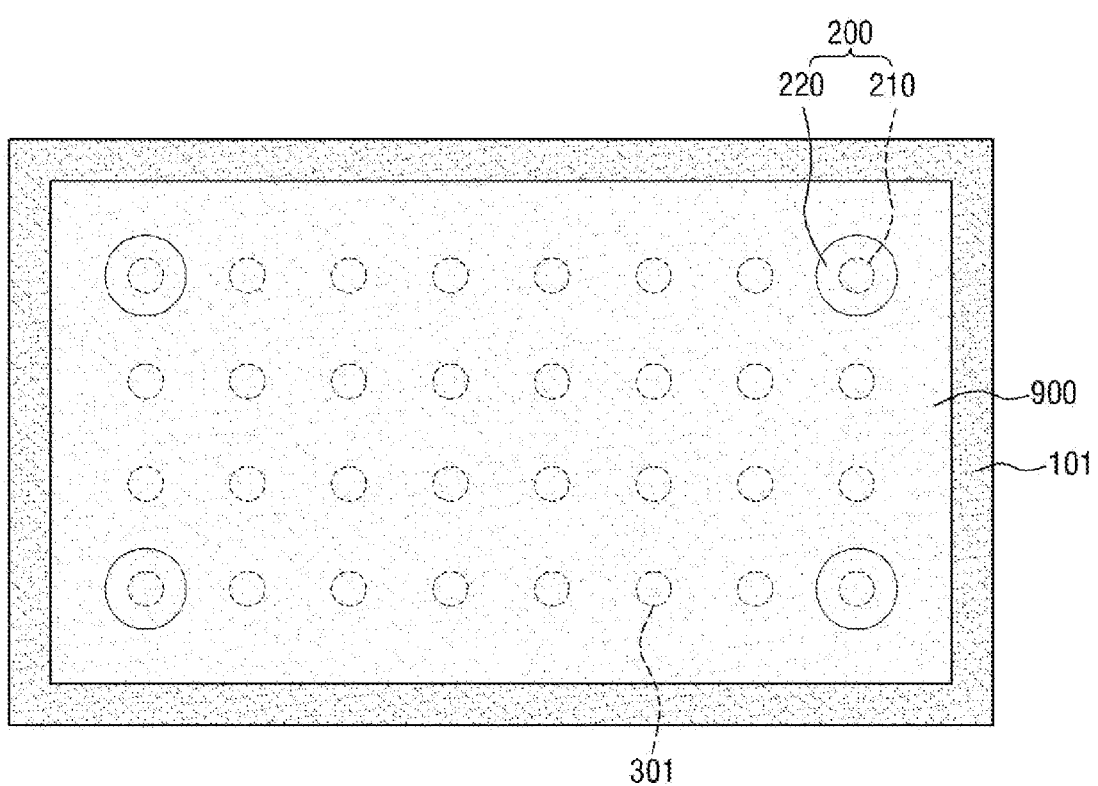
FIG. 9 is a plan view of the substrate holding apparatus of FIG. 8.

FIG. 8 is a cross-sectional of lowered lift bars 200 in a substrate holding apparatus constructed as another embodiment according to the principles of the present invention. FIG. 9 is a plan view of the substrate holding apparatus of FIG. 8. For simplicity, elements substantially identical to those of FIGS. 1 through 7 are indicated by like reference numerals, and thus a redundant description thereof will be omitted.

Referring to FIGS. 8 and 9, a diameter of a support bar 301 may be substantially equal to a diameter of a body 210 of a lift bar 200. In addition, a stage 101 may include a plurality of built-in holes 121 in a lower part thereof, and the support bar 301 may be inserted into each of the built-in holes 121. In a state where the lift bar 200 has descended, an end of the body 210 and an end of the support bar 301 may lie in the same plane A. In addition, a plurality of bodies 210 and a plurality of support bars 301 may be arranged in a matrix of rows and columns spaced at equal intervals. That is, every two adjacent ones of the bodies 210 and/or the support bars 301 may be separated by an equal distance.

As described above, in the substrate holding apparatus according to the current embodiment of the present invention, the support bars 301 and the lift bars 200 are arranged in a predetermined pattern. Therefore, the whole surface of a substrate 900 can be uniformly sucked and fixed onto the stage 101.

Figure 10:
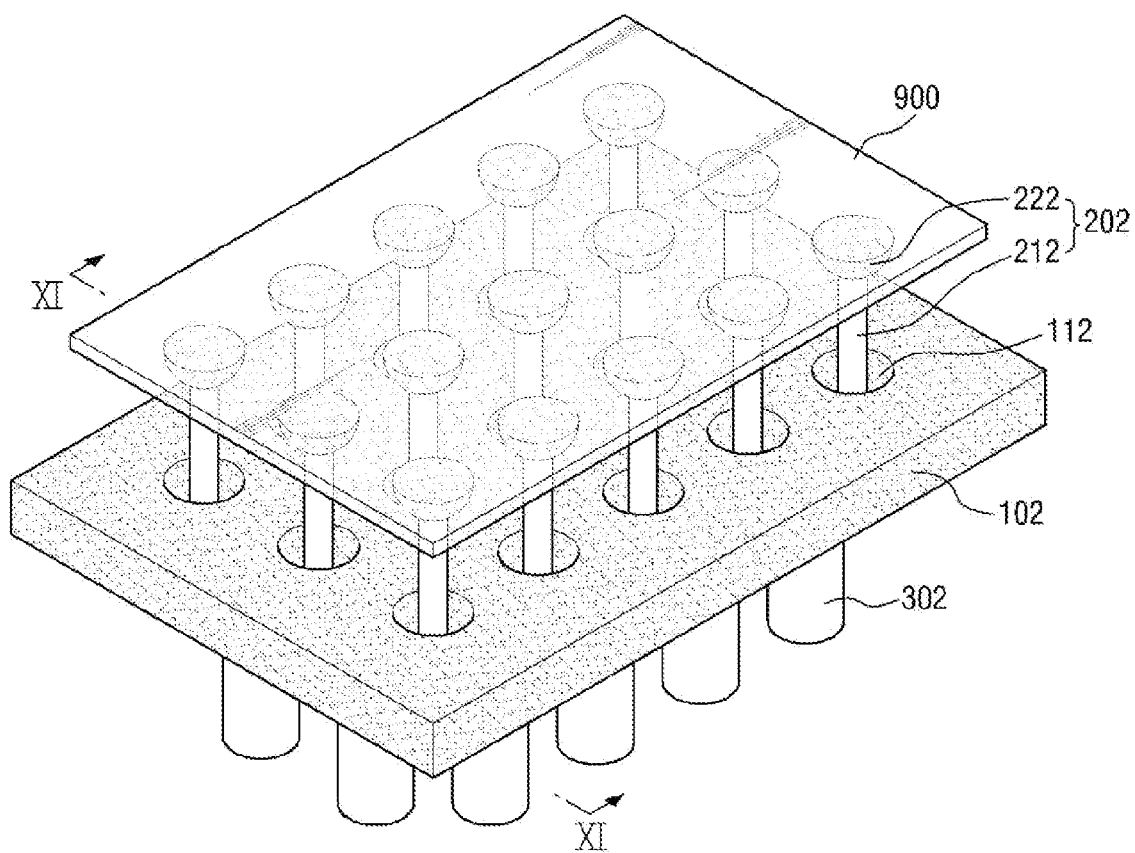
FIG. 10 is a cross-sectional of raised lift bars in a substrate holding apparatus constructed as another embodiment according to the principles of the present invention.
Figure 11:
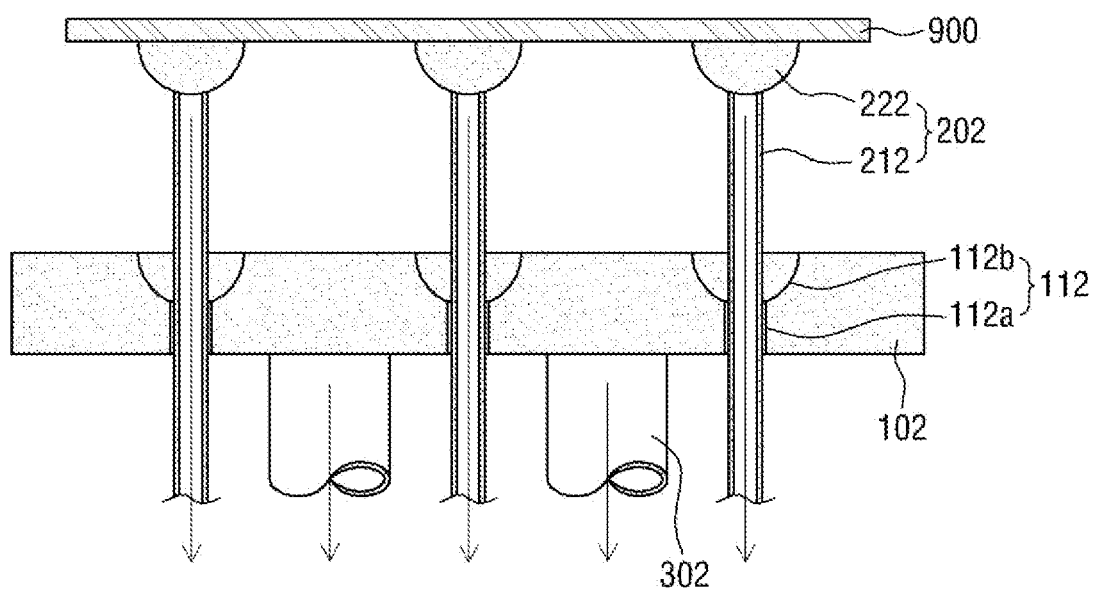
FIG. 11 is a cross-sectional view taken along line XI-XI of FIG. 10.
Figure 12:
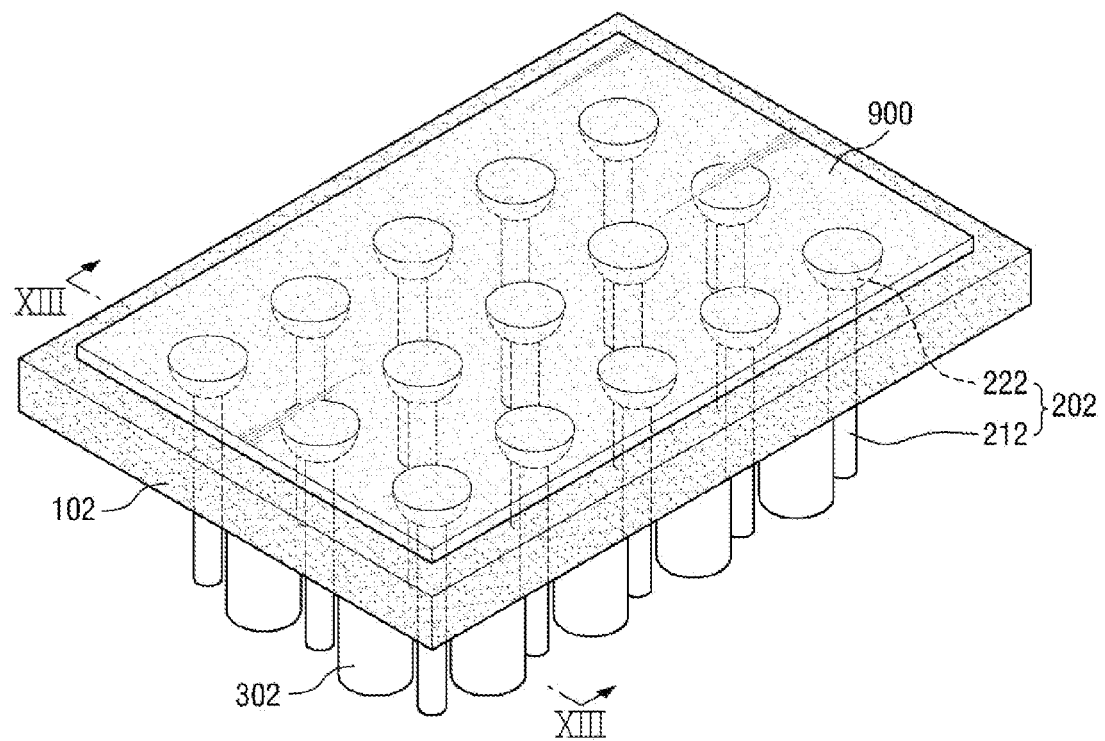
FIG. 12 is an oblique view of the lowered lift bars in the substrate holding apparatus of FIG. 10.
Figure 13:
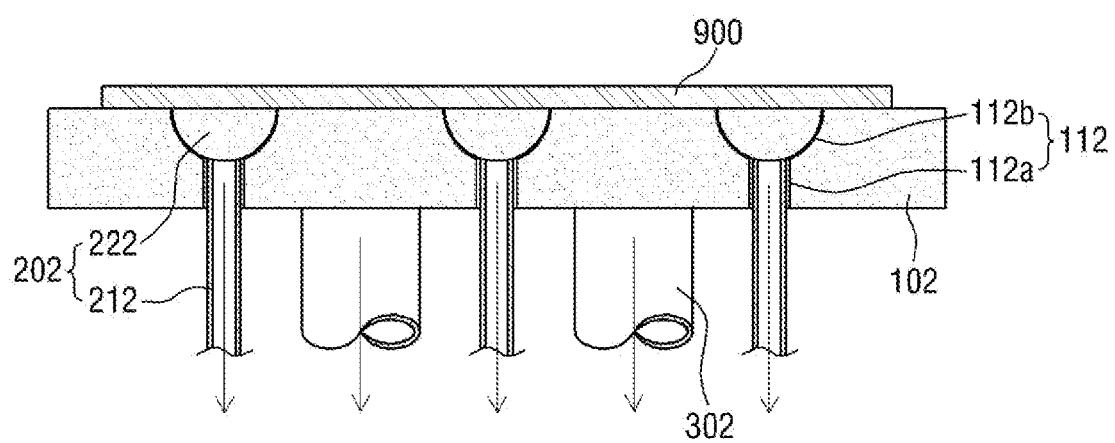
FIG. 13 is a cross-sectional view taken along line XIII-XIII of FIG. 12.
Figure 14:
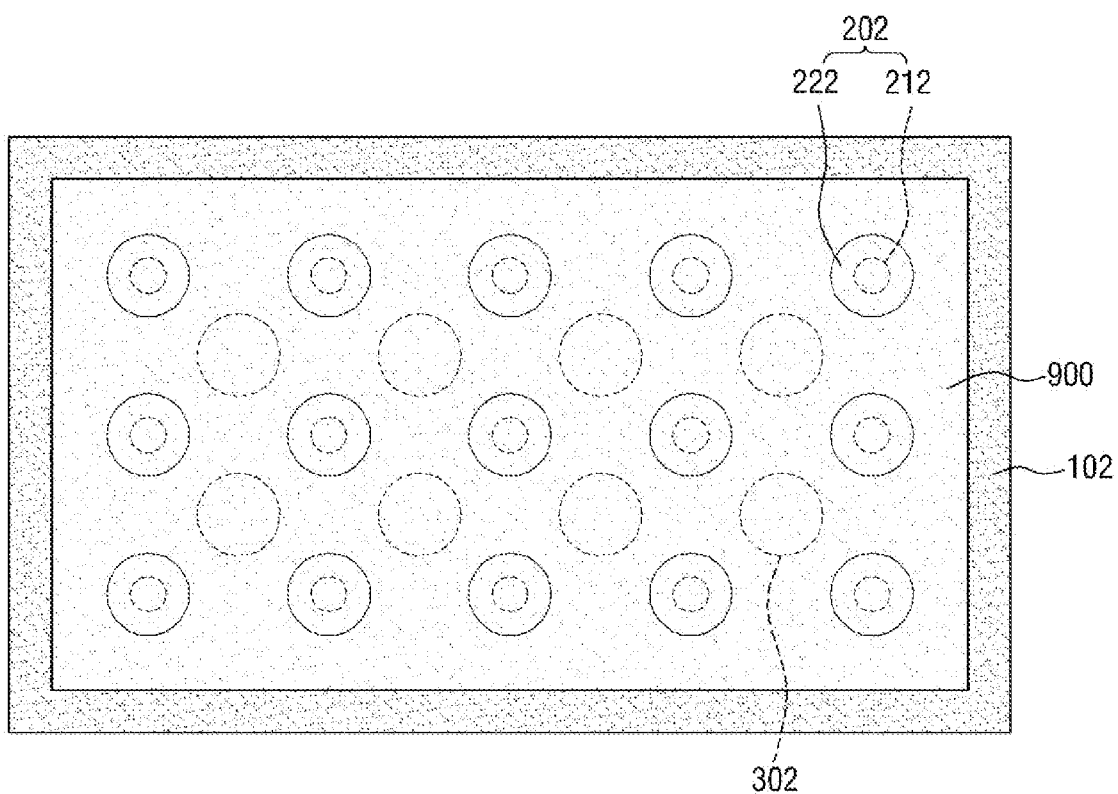
FIG. 14 is a plan view of the substrate holding apparatus of FIG. 10.

FIG. 10 is a cross-sectional of raised lift bars 202 in a substrate holding apparatus constructed as another embodiment according to the principles of the present invention. FIG. 11 is a cross-sectional view taken along line XI-XI of FIG. 10. FIG. 12 is an oblique view of the lowered lift bars 202 in the substrate holding apparatus of FIG. 10. FIG. 13 is a cross-sectional view taken along line XIII-XIII of FIG. 12. FIG. 14 is a plan view of the substrate holding apparatus of FIG. 10. For simplicity, elements substantially identical to those of FIGS. 1 through 7 are indicated by like reference numerals, and thus a redundant description thereof will be omitted.

Referring to FIGS. 10 through 14, a plurality of lift bars 202 may be provided. As described above, each of the lift bars 202 may include a body 212 and a head 222. The lift bars 202 may be arranged in a matrix of rows and columns spaced at equal intervals. That is, every two adjacent ones of the lift bars 202 may be separated by an equal distance.

A stage 102 may include a plurality of insertion holes 112 corresponding to the lift bars 202, respectively. As described above, each of the insertion holes 112 may include a first insertion hole 112a and a second insertion hole 112b.

A plurality of support bars 302 may be provided. Each of the support bars 302 may be surrounded by the lift bars 202. Like the lift bars 202, the support bars 302 may also be arranged in a matrix of rows and columns spaced at equal intervals. That is, every two adjacent ones of the support bars 302 may be separated by an equal distance. In addition, the lift bars 202 and the support bars 302 may be alternately arranged along a diagonal direction.

As described above, in the substrate holding apparatus according to the current embodiment, a substrate 900 can be fixed more stably onto the stage 102 by the lift bars 202 arranged in a matrix of rows and columns spaced at equal intervals.

Embodiments of the present invention provide at least one of the following advantages.

That is, a substrate can be stably fixed in position, and the flatness of a surface of the fixed substrate can be improved.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A substrate holding apparatus, comprising:
   a stage having a major surface disposed to receive a substrate; and
   at least one lift bar coupled to the stage and configured to move the substrate relative to the major surface of the stage, the lift bar comprising:
   a body; and
   a head connected to an end of the body to contact the substrate and formed of a porous material.

2. The apparatus of claim 1, wherein the stage and the head are formed of a same material.

3. The apparatus of claim 1, wherein each of the stage and the head are absent of any through holes.

4. The apparatus of claim 1, wherein the stage comprises at least one insertion hole, and the lift bar penetrates the insertion hole, wherein the insertion hole comprises:
   a first insertion hole which has a shape corresponding to a shape of the body; and
   a second insertion hole which is connected to the first insertion hole and has a shape corresponding to a shape of the head.

5. The apparatus of claim 4, wherein a line passing through a center of the first insertion hole and a center of the second insertion hole is perpendicular to the major surface of the stage.

6. The apparatus of claim 4, wherein when the head of the lift bar completely fills the second insertion hole, the major surface of the stage and a surface of the head opposite to the body lie in a same plane.

7. The apparatus of claim 1, wherein the body has a first inner space, the first inner space having an open first end that is connected to a first vacuum treatment unit and a first gas supply unit which provide the first inner space a pressure different from atmospheric pressure in response to a first control signal, the inner space having a second and opposite end that is covered by and connected to the head.

8. The apparatus of claim 1, wherein the stage is formed of a porous material.

9. The apparatus of claim 8, further comprising at least one support bar which supports the stage, wherein the support bar has a second inner space having first and second ends opposite to each other, wherein the first end of the second inner space being connected to a second vacuum treatment unit and a second gas supply unit which provide the second inner space a pressure different from atmospheric pressure in response to a second control signal, wherein the second end of the second inner space being connected to and covered by the stage, the vacuum and pressure produced by the second vacuum treatment unit and the second gas supply unit being transmitted to the major surface of the stage via pores within the stage.

10. The apparatus of claim 9, wherein the body has a first inner space, the first inner space having an open first end that is connected to a first vacuum treatment unit and a first gas supply unit which provide the first inner space a pressure different from atmospheric pressure in response to a first control signal, the inner space having a second and opposite open end that connects to the head, the vacuum and pressure produced by the first vacuum treatment unit and the first gas supply unit being transmitted to a surface of the head that contacts the substrate via pores within the head.

11. The apparatus of claim 10, wherein a vacuum suction force generated on the surface of the head that contacts the substrate is equal to a vacuum suction force generated on the major surface of the stage.

12. The apparatus of claim 1, wherein the lift bar is provided in plural form, and the plural lift bars are arranged in a matrix of rows and columns spaced at equal intervals.

13. A substrate holding apparatus, comprising:
    a stage having a major surface disposed to support a substrate; and
    at least one lift bar coupled to the stage and configured to move the substrate towards and away from the major surface of the stage, the lift bar comprising:
    a body; and
    a head connected to an end of the body to control the substrate, the stage and the head formed of a same material, wherein each of the head and the stage being absent of a through hole.

14. The apparatus of claim 13, wherein the stage and the head are formed of a porous material.

15. The apparatus of claim 14, wherein the stage comprises:
    a first insertion hole having a shape corresponding the body; and
    a second insertion hole connected to the first insertion hole and having a shape corresponding to the head, the lift bar penetrating the first and second insertion holes, wherein when the head of the lift bar completely fills the second insertion hole, the major surface of the stage and a surface of the head opposite to the body lie in a same plane.

16. The apparatus of claim 15, wherein the lift bar is connected to a first vacuum treatment unit and a first gas supply unit which provide the first inner space a pressure different from atmospheric pressure in response to a first control signal, the pressure being transmitted to the surface of the head opposite the body via pores within the head and not via a through hole, gap or empty space.

17. A method for using a substrate holding apparatus, the method comprising:
    raising a lift bar with respect to a major surface of a stage;
    placing a substrate on a head of the lift bar, the head formed of a porous material and being absent of any through holes; and
    lowering the lift bar with respect to the major surface of the stage.

18. The method of claim 17, wherein the stage and the head are formed of the same material.

19. The method of claim 18, further comprising sucking the substrate onto the lift bar by vacuum-treating an inner space of the lift bar after placing the substrate on the head of the raised lift bar, the vacuum in the inner space of the lift bar being transmitted to the substrate via pores in the head and not via a through hole.

20. The method of claim 18, further comprising sucking the substrate onto the stage and the lift bar by vacuum-treating an inner space of a support bar which supports the stage and an inner space of the lift bar when the substrates directly contacts the major surface of the stage, wherein a vacuum suction force generated on a surface of the head that contacts the substrate is equal to a vacuum suction force generated on the major surface of the stage.

* * * * *